United States Patent
Liu

(10) Patent No.: US 10,388,784 B2
(45) Date of Patent: Aug. 20, 2019

(54) POWER CHIP AND STRUCTURE OF TRANSISTOR

(71) Applicant: Excelliance MOS Corporation, Hsinchu County (TW)

(72) Inventor: Chu-Kuang Liu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 5 days.

(21) Appl. No.: 15/455,144

(22) Filed: Mar. 10, 2017

(65) Prior Publication Data

US 2018/0212052 A1    Jul. 26, 2018

(30) Foreign Application Priority Data

Jan. 20, 2017  (TW) .............................. 106201051 U

(51) Int. Cl.
*H01L 29/78* (2006.01)
*H01L 29/06* (2006.01)
*H01L 29/423* (2006.01)

(52) U.S. Cl.
CPC ...... *H01L 29/7816* (2013.01); *H01L 29/0696* (2013.01); *H01L 29/4238* (2013.01)

(58) Field of Classification Search
None
See application file for complete search history.

(56) References Cited

U.S. PATENT DOCUMENTS

| | | |
|---|---|---|
| 5,355,008 A | 10/1994 | Moyer et al. |
| 5,447,876 A | 9/1995 | Moyer et al. |
| 5,517,046 A | 5/1996 | Hsing et al. |
| 6,388,292 B1 | 5/2002 | Lin |
| 6,818,950 B1 | 11/2004 | Mallikarjunaswamy |
| 7,956,384 B2 | 6/2011 | Mallikararjunaswamy |
| 2008/0122014 A1* | 5/2008 | Shimomura ........ H01L 29/4238 257/401 |
| 2009/0101990 A1* | 4/2009 | Kang .................. H01L 29/0692 257/379 |
| 2014/0346611 A1* | 11/2014 | Oh .................... H01L 27/11286 257/383 |
| 2015/0091095 A1* | 4/2015 | Lin ..................... H01L 29/4238 257/390 |
| 2015/0287820 A1 | 10/2015 | Mallikarjunaswamy |
| 2016/0133645 A1 | 5/2016 | Crandall |

\* cited by examiner

*Primary Examiner* — Charles D Garber
*Assistant Examiner* — Xiaoming Liu
(74) *Attorney, Agent, or Firm* — JCIPRNET

(57) ABSTRACT

A power chip and a transistor structure thereof are provided. The transistor structure includes a semiconductor substrate, a plurality of gate structures, a plurality of first doped regions and a second doped region. The gate structures are disposed on the semiconductor substrate. The first doped regions are formed respectively in a plurality of first areas surrounded by the gate structures. The second doped region is formed in a second area among the gate structures. Each of the gate structures is arranged in an enclosed ring, and the shape of each of the gate structures is octagon.

9 Claims, 5 Drawing Sheets

POWER CHIP AND STRUCTURE OF TRANSISTOR

CROSS-REFERENCE TO RELATED APPLICATION

This application claims the priority benefits of Taiwan application serial no. 106201051, filed on Jan. 20, 2017. The entirety of the above-mentioned patent application is hereby incorporated by reference herein and made a part of this specification.

BACKGROUND OF THE INVENTION

Field of the Invention

The invention relates to a power chip and a transistor structure thereof, particularly to a transistor structure that increases the ratio of a channel width to a layout area in a power chip.

Description of Related Art

Given that the power transistor set in power chips usually needs to endure rather high stressed voltage, the area needed for layout is usually relatively large. Thus, the transistor channel that can be formed in a unit of layout area is often limited in power chips. As a result, increasing the size of the transistor channels that are formed in a unit of layout area in power chips becomes an important technical issue in this field.

SUMMARY OF THE INVENTION

The invention provides a power chip and a transistor structure thereof that increase the ratio of a channel width to a layout area of the transistor in the power chip.

The transistor structure of the invention includes a semiconductor substrate, a plurality of gate structures, a plurality of first doped regions, and a second doped region. The gate structures are disposed on the semiconductor substrate. The first doped regions are respectively formed in a plurality of first areas that are surrounded by the gate structures respectively. The second doped region is formed in a second area that locates between the gate structures. Each of the gate structures is arranged in an octagonal enclosed ring.

In an embodiment of the invention, the gate structures include a first gate structure, a second gate structure, a third gate structure, and a fourth gate structure. The transistor structure further includes a first bridge tap structure and a second bridge tap structure. The first bridge tap structure is formed between the first and the second gate structures and connects the first and the second gate structures. The second bridge tap structure is formed between the third and the fourth gate structures and connects the third and the fourth gate structures.

In an embodiment of the invention, the first bridge tap structure, the second bridge tap structure, and the gate structures include the same material.

In an embodiment of the invention, the first doped regions and the second doped region have the same conductivity type.

In an embodiment of the invention, the transistor structure further includes a third doped region. The third doped region is formed in the second area that locates between the gate structures. The third doped region is adjacent to the second doped region and has a conductivity type opposite to the conductivity type of the second doped region.

In an embodiment of the invention, the second doped region and the third doped region are disposed in a well area. The first doped regions are disposed outside the well area. A drift region is formed between the first doped regions and the well area.

In an embodiment of the invention, the transistor structure further includes a plurality of first connectors and a second connector. The first connectors are disposed respectively on the first doped regions and are electrically connected with the first doped regions respectively. The second connector is disposed on the second doped region and is electrically connected with the second doped region.

In an embodiment of the invention, the second connector includes a plurality of sub-connectors. The sub-connectors are disposed respectively on the second doped region corresponding to a center location.

In an embodiment of the invention, the second connector is in a rectangular shape or a cruciform shape.

The power chip of the invention includes the above-identified transistor structure and a core circuit. The core circuit is coupled to the transistor structure.

Based on the above, the invention provides a transistor structure that is formed with gate structures arranged in octagonal enclosed rings, resulting in an increase in the ratio of the channel width to the layout area of the transistor structure and thus increasing the work effectiveness of the transistor.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
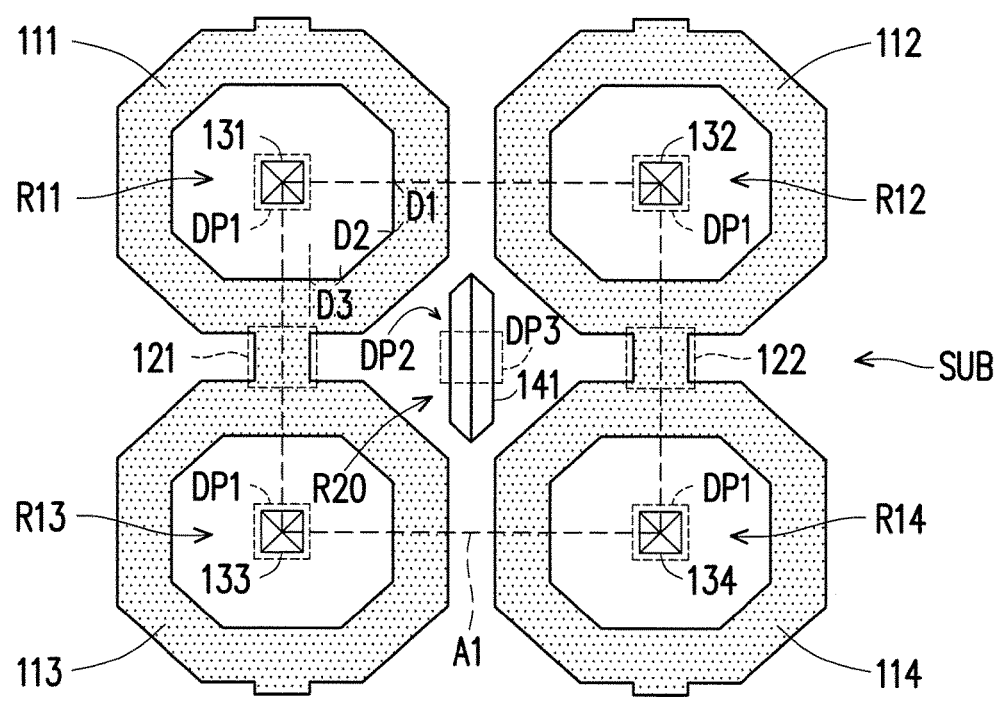
FIG. 1 is a diagram showing the transistor structure according to an embodiment of the invention.

Please refer to FIG. 1. FIG. 1 is a diagram showing a transistor structure according to an embodiment of the invention. The transistor structure 100 is adapted to be disposed in an integrated circuit. In an embodiment of the invention, the transistor structure 100 is a complementary metal-oxide-semiconductor field-effect transistor (MOSFET). A transistor structure 100 includes a semiconductor substrate SUB, gate structures 111-114, a plurality of first doped regions DP1 disposed in areas R11-R14 respectively, and a second doped region DP2 and a third doped region DP3 disposed in an area R20. The areas R11-R14 are surrounded by the gate structures 111-114 respectively and the area R20 is located between the gate structures 111-114.

The transistor structure 100 further includes bridge tap structures 121 and 122 and connectors 131-134 and 141. The bridge tap structure 121 is disposed between sides of the gate structures 111 and 113, and the sides of the gate structures 111 and 113 are adjacent to each other. Two ends of the bridge tap structure 121 are connected to the gate structures 111 and 113 respectively and couple the gate structures 111 and 113 to each other. The bridge tap structure 122 is disposed between the gate structures 112 and 114 on the sides that are adjacent to each other. Two ends of the bridge tap structure 122 are connected to the gate structures 112 and 114 respectively and couple the gate structures 112 and 114 to each other.

The connectors 131-134 are disposed in the areas R11-R14 respectively and are electrically connected with the first doped regions DP1 in the areas R11-R14 respectively. The first doped regions DP1 serve as a drain of the transistor structure 100. The connector 141 is disposed in the area R20 and is electrically connected with the second doped region DP2 in the area R20. The second doped region DP2 serves as a source of the transistor structure 100. In the embodiment of the invention, the connector 141 is electrically connected with both the second doped region DP2 and the third doped region DP3. The third doped region DP3 serves as a bulk electrode of the transistor structure 100.

Particularly, each of the gate structures 111-114 of the invention is arranged in an octagonal enclosed ring. In the embodiment, the shapes and dimensions of the gate structures 111-114 are identical. Furthermore, a channel width of the transistor structure 100 equals (D1+D2+D3)×4 in a rectangle area A1 formed with the connectors 131-134 as end points. Provided that the rectangle area A1 is a square, a side length of which equals DA, a ratio of the channel width to a layout area of the transistor structure 100 equals (D1+D2+D3)×4/(DA×DA).

A practical example is provided here for better understanding. In the example, the side length of the rectangle area A1 equals 3.34 μm, wherein the layout area equals 3.34×3.34×μm$^2$=11.15 μm$^2$. The channel width equals (0.39+0.834+0.233)×4=5.828 μm. The ratio of the channel width to the layout area of the transistor structure 100 equals 5.828/11.15=0.522.

It should also be noted that, in this embodiment, each of the gate structures 111-114 includes a poly gate layer, and the bridge tap structures 121 and 122 have the same material as the gate structures 111-114. Additionally, in this embodiment, the conductivity types of the first doped regions DP1 and the third doped region DP3 are identical, while the conductivity types of the second doped region DP2 and the third doped region DP3 are opposite.

In addition, number of the gate structures included in the transistor structure 100 is not limited to four. The number of the gate structures may be increased by expanding the transistor structure 100 towards different directions with the architecture depicted in FIG. 1. The depiction of FIG. 1 is merely an exemplary embodiment. The invention is not limited to this embodiment.

Figure 2:
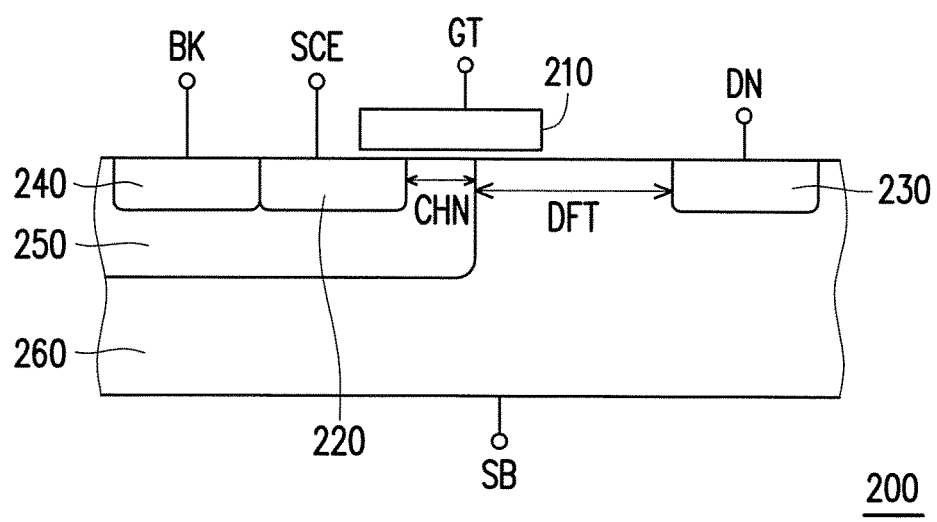
FIG. 2 is a cross-sectional diagram showing a part of the transistor structure according to an embodiment of the invention.

Please refer to FIG. 2. FIG. 2 is a cross-sectional diagram showing a part of a transistor structure according to an embodiment of the invention. A transistor structure 200 includes a semiconductor substrate 260, a first doped region 230, a second doped region 220, a third doped region 240, a well area 250, and a gate structure 210. The semiconductor substrate 260 is connected to an electrode SB. The gate structure 210 is connected to a gate electrode GT. The well area 250 is formed in the semiconductor substrate 260. The second doped region 220 and the third doped region 240 are disposed in the well area 250 to be adjacent to each other. The well area 250 serves as a substrate of the transistor structure 200. The second doped region 220 and the third doped region 240 are connected to an electrode SCE and a basal electrode BK respectively. Furthermore, the first doped region 230 is formed in the semiconductor substrate 260 to be located outside of the well area 250, and is connected to a drain electrode DN.

The gate structure 210 covers a part of the second doped region 220, a part of the well area 250, and a part of the semiconductor substrate 260. A channel CHN is formed in the part of the well area 250 (between the second doped region 220 and the semiconductor substrate 260) which is covered by the gate structure 210. A drift region DFT is formed between the well area 250 and the first doped region 230.

It should also be noted that the first doped region 230 and the second doped region 220 have identical conductivity types (N+, for instance). The conductivity type of the third doped region 240, however, is opposite to the conductivity type of the second doped region 220.

In the embodiment, the gate structure 210 is arranged in an octagonal enclosed ring as shown in FIG. 1 and surrounds the first doped region 230. Since FIG. 2 is a partially cross-sectional view, it does not disclose the gate structure 210 surrounding the first doped region 230. Nevertheless, with reference to the depiction of both FIG. 1 and FIG. 2, persons having ordinary skill in the art are still able to learn the arrangement of the transistor structure of the invention.

Figure 3:
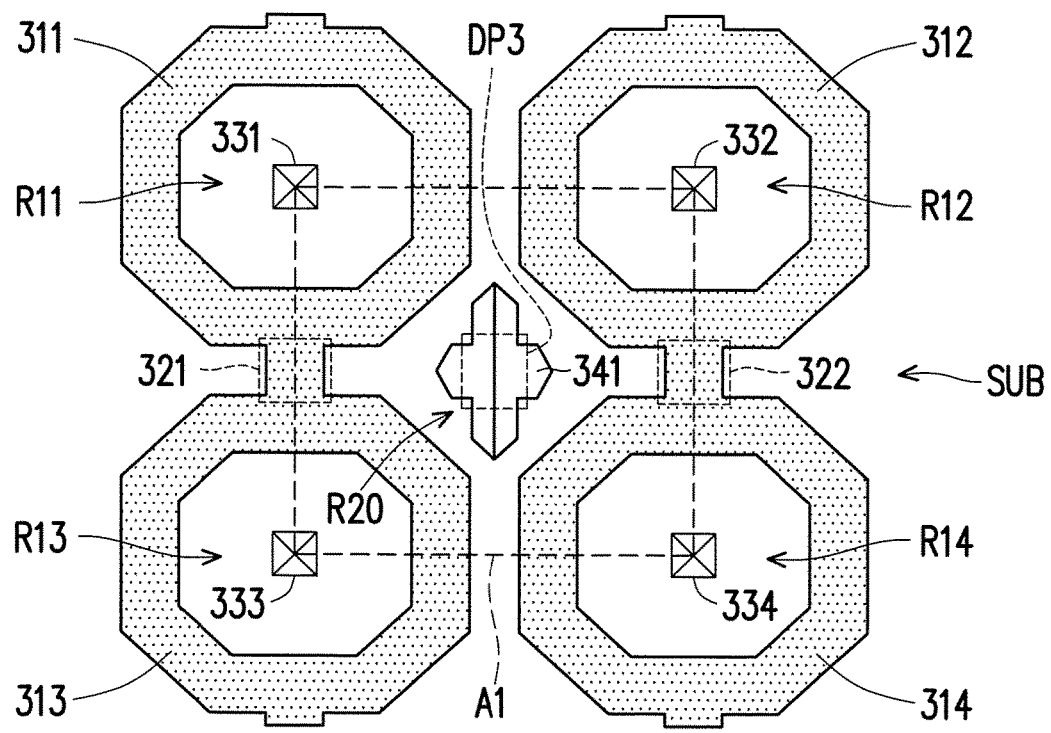
FIG. 3 is a diagram showing the transistor structure according to another embodiment of the invention.

Please refer to FIG. 3. FIG. 3 is a diagram showing a transistor structure in another embodiment of the invention. A transistor structure 300 includes gate structures 311-314, bridge tap structures 321 and 322, and connectors 331-334 and 341. The bridge tap structure 321 connects the gate structures 311 and 313. The bridge tap structure 322 connects the gate structures 312 and 314. The connectors 331-334 are electrically connected to the first doped regions in areas R11-R14. The connector 341 is electrically connected with the second doped region in an area R20 and covers a third doped region DP3 partially or fully.

It should also be noted that the connector 341 in the embodiment is disposed in the area R20 in a cruciform shape. Through the cruciform arrangement, the area of connection between the connector 341 and the second doped region is increased to lower the resistance of the interface.

Figure 4:
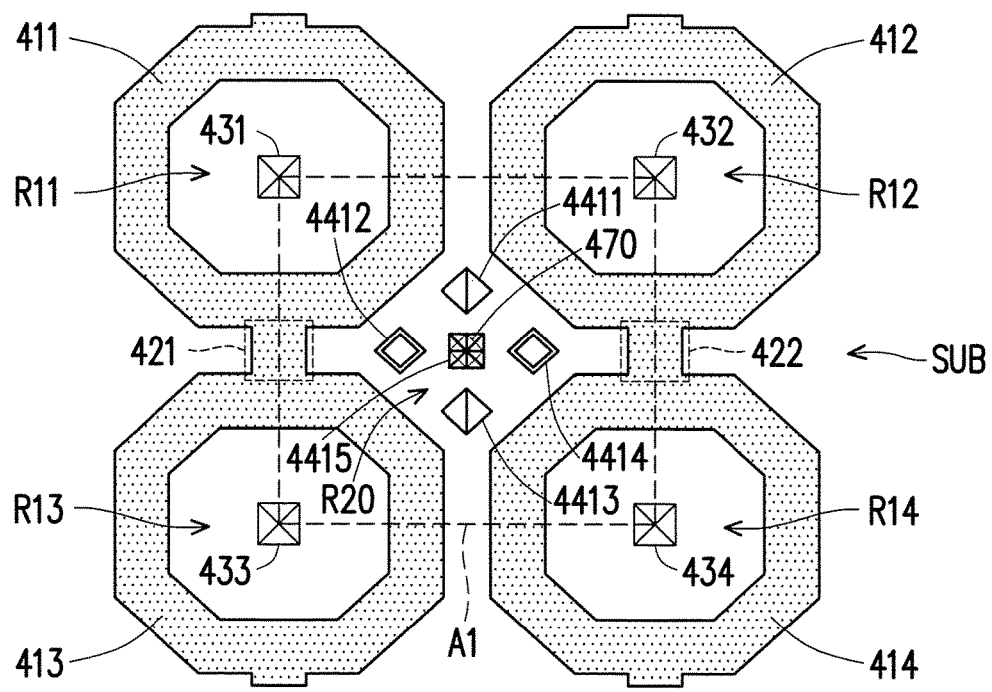
FIG. 4 is a diagram showing the transistor structure according to yet another embodiment of the invention.

Please refer to FIG. 4 hereinafter. FIG. 4 is a diagram showing a transistor structure in yet another embodiment of the invention. A transistor structure 400 includes gate structures 411-414, bridge tap structures 421 and 422, connectors 431-434, and sub-connectors 4411-4415. The bridge tap structure 421 connects the gate structures 411 and 413. The bridge tap structure 422 connects the gate structures 412 and 414. The connectors 431-434 are electrically connected with the first doped regions in the areas R11-R14. The sub-connectors 4411-4415 are electrically connected with the second doped region in the area R20.

It should also be noted that, in this embodiment, the sub-connectors 4411-4415 are electrically connected with the second doped region and a third doped region 470 in the area R20. The sub-connectors 4411-4414 are disposed on the second doped region in the area R20 respectively corresponding to a center location in the area R20. In the embodiment, the center location is the layout location of the third doped region 470. The sub-connector 4415 is arranged in the third doped region 470 and electrically connected with the third doped region 470. The symmetric layout of the sub-connectors 4411-4414 to the center location evens the interfaces between the sub-connectors 4411-4414 and the second doped region and increases the efficiency in the source current conveyance.

Figure 5:
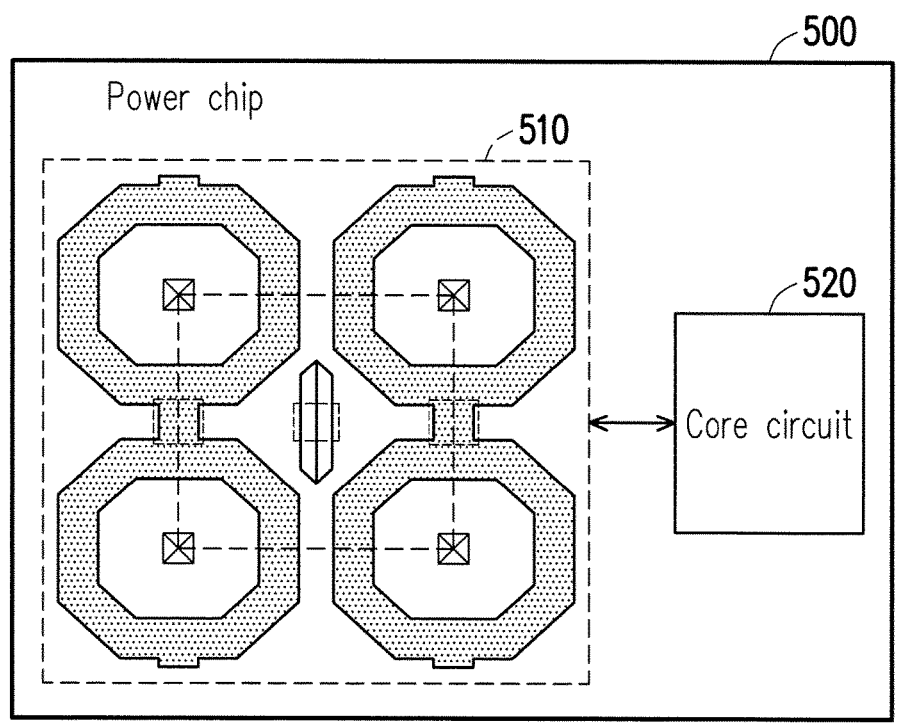
FIG. 5 is a diagram showing the power chip according to an embodiment of the invention.

Please refer to FIG. 5. FIG. 5 is a diagram showing a power chip in an embodiment of the invention. In FIG. 5, a power chip 500 includes a transistor structure 510 and a core circuit 520. The transistor structure 510 is coupled to the core circuit 520. The transistor structure 510 is disposed as the embodiments in FIG. 1, FIG. 3, and FIG. 4. The core circuit 520 can be a digital, analog, or mixed mode circuit. The core circuit 520 is used to receive and transmit an electrical signal from and to the transistor structure 510.

To conclude, according to the invention, the layout of the transistor structure is achieved with use of the specific gate structure. It relatively widens the channel width of the transistor within limited layout area efficiently, increases the ratio of the channel width to the layout area, and increases the work effectiveness of the transistor.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A transistor structure, comprising:
   a semiconductor substrate;
   a plurality of gate structures disposed on the semiconductor substrate, the plurality of gate structures comprising a first gate structure, a second gate structure, a third gate structure, and a fourth gate structure;
   a plurality of first doped regions formed respectively in a plurality of first areas that are surrounded by the gate structures respectively; and
   a second doped region formed in a second area that locates between the gate structures;
   a first bridge tap structure formed between the first gate structure and the second gate structure and connecting the first gate structure and the second gate structure;
   a second bridge tap structure formed between the third gate structure and the fourth gate structure and connecting the third gate structure and the fourth gate structure, wherein the first bridge tap structure is physical isolated from the second bridge tap structure,
   wherein each of the gate structures is arranged in an octagonal enclosed ring, and
   wherein the plurality of first doped regions comprises 4 first doped regions, and the 4 first doped regions form a rectangle area; and
   a third doped region formed in the second area that locates between the gate structures, wherein the third doped region contacts the second doped region, where the second doped region forms a source of the transistor structure and the third doped region forms a bulk electrode of the transistor structure.

2. The transistor structure according to claim 1, wherein the first bridge tap structure, the second bridge tap structure, and the gate structures comprise the same material.

3. The transistor structure according to claim 1, wherein the first doped regions and the second doped region have the same conductivity type.

4. The transistor structure according to claim 1, wherein a conductivity type of the third doped region is opposite to a conductivity type of the second doped region.

5. The transistor structure according to claim 4, wherein the second doped region and the third doped region are disposed in a well area and the first doped regions are disposed outside the well area, and a drift region is formed between the first doped regions and the well area.

6. The transistor structure according to claim 1, further comprising:
   a plurality of first connectors disposed respectively on the first doped regions and electrically connected with the first doped regions respectively; and
   a second connector disposed on the second doped region and electrically connected with the second doped region.

7. The transistor structure according to claim 6, wherein the second connector comprises a plurality of sub-connectors, which are disposed on the second doped region respectively and are symmetric to a center location.

8. The transistor structure according to claim 6, wherein the second connector is in a rectangular shape or a cruciform shape.

9. A power chip, comprising:
   the transistor structure according to claim 1; and
   a core circuit coupled to the transistor structure.

* * * * *